SILICON SOLAR CELLS WITH ATTACHED CONTACTS

Original Filed Nov. 10, 1958

INVENTORS
LOWELL S. PELFREY
KURT KADELBURG
BY MILO V. MACHA
OSTROLENK, FABER, GERB & SOFFEN
ATTORNEYS

United States Patent Office 3,147,414
Patented Sept. 1, 1964

3,147,414
SILICON SOLAR CELLS WITH ATTACHED CONTACTS

Lowell S. Pelfrey, Manhattan Beach, Kurt Kadelburg, West Los Angeles, and Milo V. Macha, Los Angeles, Calif., assignors to International Rectifier Corporation, El Segundo, Calif., a corporation of California Original application Nov. 10, 1958, Ser. No. 773,022. Divided and this application Sept. 29, 1960, Ser No. 59,291
3 Claims. (Cl. 317—240)

This invention relates to solar cells and more particularly to means for making external contacts to them and is a division of co-pending application Serial No. 773,022 filed November 10, 1958, now abandoned and assigned to the assignee of the instant application.

Solar cells are well known. A common form of such a cell comprises a wafer of N-type silicon having diffused into one side thereof a doping material such as boron, aluminum, gallium or indium, to create a thin P-type silicon layer in the region of the diffusion. This creates a P-N junction near the surface. The action of light directed on such a surface creates a voltage in the region of the junction in a well known manner. In order to utilize the power thus generated, contact must be made to the P-type silicon and also to the N-type silicon. This has commonly been done by depositing a plating of nickel on the P-type layer, and also a plating of nickel on the opposite or base side of the N-type silicon. Terminal leads or members were then soldered to the respective nickel coatings to constitute the two terminals of the cell.

In the use of cells provided with such contacts, it has been found that the contact between the nickel and the silicon was sometimes destroyed by heating at temperatures as high as about 200° C. particularly at the P-type surface; and furthermore the contacts were often found to be not mechanically strong enough to withstand moderate pulling.

In accordance with the present invention there are provided contacts which are able to withstand much higher temperatures than 200° C., even as high as 575° C. and above; and furthermore, the contacts are capable of withstanding much higher tensions without being damaged than the previously known types of contacts. The invention is carried out by the formation of contacts which alloy with the silicon.

In accordance with a preferred feature, the contacting element comprises an alloy containing iron and nickel, and preferably an alloy of iron, nickel and cobalt. A preferred alloy composition for this purpose is that known as Kovar.

The invention will be better understood from the following description and the accompanying drawing of which:

Figure 1:
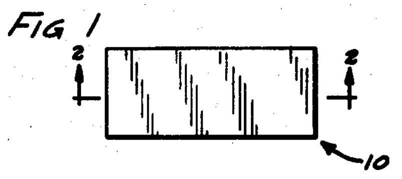
FIGURE 1 is a top view of a wafer used to form a solar cell according to this invention.
Figure 2:
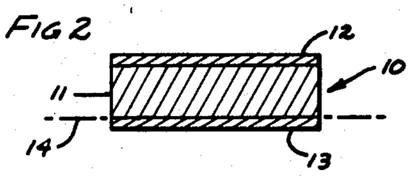
FIGURE 2 is a cross-section view taken at line 2—2 of FIGURE 1.
Figure 3:
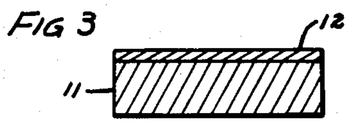
FIGURE 3 is a cross-section view of the wafer of FIGURE 2 showing a bottom layer removed.
Figure 4:
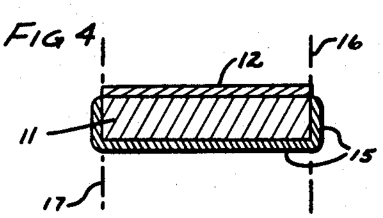
FIGURE 4 shows the wafer of FIGURE 3 provided with a metallizing layer.

FIGURES 1 and 2 show a solar cell 10 of known type comprising silicon crystal 11. According to a well known form of solar cell, the silicon in this instance is selected as N-type, and there is diffused into its surface a doping material which has the effect of making this diffused layer a P-type silicon. Suitable doping materials for creating P-type silicon at the surface are boron, aluminum, gallium and indium. When boron is used, for example, the boron diffusion can effectively be carried out in a well known manner by application of boron trichloride to the silicon surface at a high temperature, for example, around 1,000° C. After the application of the boron, all the surfaces are then preferably cleaned thoroughly, as by treatment with hot concentrated nitric acid. For the purpose of making a solar cell, all of the boron diffused layer, except that at the top surface, is ordinarily removed. In FIGURE 2 the boron diffused layer is shown at the top as layer 12, and at the bottom as layer 13. This boron diffused layer has already been removed from the side surfaces as by lapping or grinding. The lower boron diffused surface 13 will be removed below the broken line 14 by mechanical abrasion. Next, the surface 12 is covered by a suitable masking material (not shown) which may, for example, be a teflon tape or the like, and the element is then preferably cleaned in a suitable bath which may be, for example, one containing a detergent or wetting agent, for the purpose of cleaning the unmasked surfaces. Then the element has its unmasked portions covered evenly with a coating of nickel 15 as shown in FIGURE 4, which is preferably done by immersion in an electrodeless nickel plating solution. This is a well known operation needing no further discussion here.

At this point, the lower surface 15 is suitably masked, and the nickel is removed from the side and end edges, that is, to the right of broken line 16 and to the left of broken line 17 in FIGURE 4, which may be done by etching or grinding. The masks are now removed, which will leave the element with the upper layer 12 and the lower coating 15 of nickel as shown in FIGURE 5.

Figure 5:
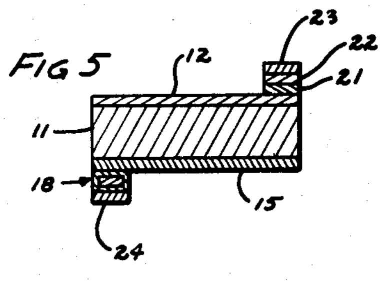
FIGURE 5 is a cross-section view showing the wafer of FIGURE 4 in a trimmed condition and provided with contacting members according to the present invention.
Figure 6:
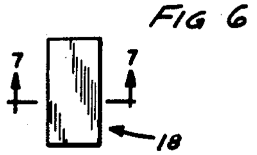
FIGURE 6 shows a strip of alloy metal used in forming a contact in the arrangement of FIGURE 5.
Figure 7:
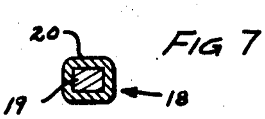
FIGURE 7 is a cross-section view taken at line 7—7 of FIGURE 6.

To form a contact or terminal on the nickel coated side, there is formed a terminal member 18 as shown in FIGURES 6 and 7. This should be a metal whose temperature expansion characteristic substantially matches that of silicon. It comprises a strip 19 of an alloy containing iron and nickel; and it is preferably an alloy of iron, nickel and cobalt, although an alloy of iron and nickel may be used. When the alloy consists of iron and nickel as the essential alloy metals, the proportion of the iron to the nickel should range from about 50% to 60% iron and about 40% to 50% nickel, by weight, the two metals being assumed to make up 100% of the alloy. When the preferred alloy of iron, nickel and cobalt is used as the essential ingredients, the proportion of these three metals to each other should be about in the range 50% to 60% iron, 25% to 30% nickel and 15% to 20% cobalt, by weight, and the quantities of these metals will be selected within these ranges to make up 100% of the alloy. The preferred composition for the alloy is that known as Kovar, which is an alloy composed of 54% iron, 28% nickel and 18% cobalt, by weight. The terminal strip 19 may conveniently be about .003 to .005 inch thick, and it may conveniently have a width of about one millimeter. The length of the strip should be about equal to the width of the wafer (FIGURE 1) for which it is to be the terminal. Before attaching the strip 19 to the solar cell, it is covered with a covering or coating 20 of an alloy having a major proportion of lead and a minor proportion of copper, and preferably some silver. Thus, the coating alloy may consist essentially of lead with approximately 1% or a little less, by weight, of copper in the entire alloy. A preferred alloy for the coating or covering, however, is one containing several percent by weight of silver, for example, around 5%, but not more than about 10%, by weight, of silver, in addition to the lead and copper; in which case the copper can be present in the proportion of about .4% to 1.5% by weight, and the remainder will be lead. A preferred alloy for this purpose has the composition 94.4% lead, 5% silver and .6% copper, by weight. The covering 20 may conveniently be about .002 inch thick. The covering 20 may be applied by dipping the strip 19 in the coating alloy while the latter alloy is molten, and thereafter allowing the alloy coating 20 to solidify, whereupon it becomes intimately adherent to the strip 19. The terminal member 18 is then attached to the nickel-coated side of the wafer, preferably at one end of the wafer, as shown in FIGURE 5. This attaching operation may conveniently be done by placing the contact member 18 in a suitable jig and then placing the nickel plate layer 15 of the cell in contact with it.

Figure 8:
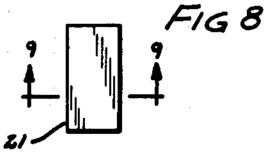
FIGURE 8 shows another strip of metal used in forming a contact in the arrangement of FIGURE 5.
Figure 9:
FIGURE 9 is a cross-section view taken at line 9—9 of FIGURE 8.
Figure 10:
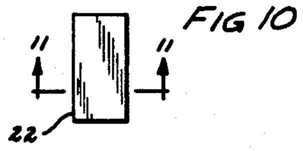
FIGURE 10 shows another metallic strip used in forming a contact in the arrangement of FIGURE 5.
Figure 11:
FIGURE 11 is a cross-section view taken at line 11—11 of FIGURE 10.

For the purpose of attaching a contact or terminal on the boron diffused surface of the wafer, there is provided a strip 21 of aluminum (FIGURES 8 and 9) which may conveniently be about .003 to .005 inch in thickness, and about one millimeter in width, and of a length about equal to the width of the wafer. That is to say, the aluminum strip is preferably of the same order of dimensions as the strip 19. Over this aluminum strip 21 there is placed a strip 22 which should be an alloy having a composition like that described in connection with strip 19, preferably Kovar, and it is preferably of substantially the same dimensions as the aluminum strip 21.

While these contact or terminal members 18, 21 and 22 are thus held in a jig in relation to the wafer 11 as shown in FIGURE 5, heat is applied to a sufficiently high temperature to produce a sintering of the metals of the contact members to each other and to the adjacent members of the solar cell. A temperature of about 800° C. is satisfactory for this purpose. A non-oxidizing atmosphere, such as a hydrogen atmosphere is preferred during this heating.

At the region of the boron diffused layer 12 there will be created by this heat treatment an alloy of silicon and aluminum where aluminum of the strip 21 diffuses into the silicon with which it is in contact. This will securely attach the aluminum strip 21 to the layer 12. Furthermore, the Kovar strip 22 will become firmly secured to the aluminum by diffusion and consequent alloying of the Kovar (or ferrous alloy) and the aluminum. At the same time, the sintering action will produce at the nickel layer 15, in the region where the contact member 18 is located, an alloy of silicon, copper, lead and silver, with some nickel in the alloy. This also will provide a firm contact between member 18 and the silicon layer 11.

After the sintering operation, and the temperature has cooled down, a suitable solder 23 is preferably applied over the Kovar layer 22 and another strip of solder 24 is preferably applied over the exposed surface of contact member 18 as shown in FIGURE 5. This solder may be applied by an ordinary heating operation well below the 800° C. temperature. The solder is for the purpose of applying electrical connections to the respective contact members.

It will be recognized that by my invention I have provided attachments of contact members to the silicon wafer, which are strong and durable.

While there has been illustrated and described a solar cell made of N-type silicon doped with boron to produce a P-type surface layer to create the P-N junction, it will be understood that the use of the upper contact members 21, 22 is not limited to a solar cell doped with boron. These contact elements are applicable in general to semi-conductor units made of N-type silicon crystal with a P-type surface layer. The lower contact 18 is useful for connection with any N-type silicon crystal.

It should be understood that the relative sizes and thicknesses of parts shown in the drawing are not intended to indicate proportionate dimensions. In many instances thicknesses are exaggerated in the drawings for convenience of illustration.

It will be understood that the invention is not limited to the particular embodiment illustrated and described, but only in accordance with the appended claims.

What is claimed is:

1. In combination, a silicon crystal semi-conductor wafer having a nickel coating on a side thereof and a contact member attached to said coating, said contact member comprising:

(a) a strip constituted of an alloy selected from the group consisting of
   (1) from 50% to 60% iron and 40% to 50% nickel and
   (2) from 50% to 60% iron, 25% to 30% nickel and 15% to 20% cobalt, all percentages by weight; and (b) a coating on said strip constituted of a second alloy selected from the group consisting of
   (1) up to 1% copper with the remainder essentially lead and
   (2) from 5% to 10% silver, 0.4% to 1.5% copper, and the remainder essentially lead, all percentages by weight;

the coating of said second alloy being in contact with the nickel coating, and said contact member being alloyed with said silicon.

2. In combination, a silicon crystal semi-conductor wafer having a nickel coating on a side thereof and a contact member attached to said coating, said contact member comprising, a strip constituted of an alloy of from 50% to 60% iron, 25% to 30% nickel and 15% to 20% cobalt, and a coating on said strip constituted of a second alloy of from 5% to 10% silver, from 0.4% to 1.5% copper, and the remainder essentially lead, all of the preceding percentages being given by weight, the coating of said second alloy being in contact with the nickel coating, and said contact member being alloyed with said silicon wafer.

3. In combination, a silicon crystal semi-conductor wafer having a nickel coating on a side thereof and a contact member attached to said coating, said contact member comprising, a strip constituted of an alloy of 54% iron, 28% nickel and 18% cobalt and having a coating thereon constituted of a second alloy of 94.4% lead, 5% silver and 0.6% copper, by weight, the second alloy coating being in contact with the nickel coating on the silicon semi-conductor wafer and the contact member being alloyed with the silicon wafer.

References Cited in the file of this patent

UNITED STATES PATENTS

| | | |
|---|---|---|
| 2,623,273 | Murray et al. | Dec. 30, 1952 |
| 2,796,563 | Ebers et al. | June 18, 1957 |
| 2,863,105 | Ross | Dec. 2, 1958 |
| 2,982,893 | Spanos | May 2, 1961 |